(12) United States Patent
Zhang

(10) Patent No.: US 11,835,308 B1
(45) Date of Patent: Dec. 5, 2023

(54) WATER COOLING PLATE AND WATER COOLING RADIATOR HAVING SAME

(71) Applicant: Dongguan Yichen Intelligent Electronics Co., Ltd., Dongguan (CN)

(72) Inventor: Pan Zhang, Dongguan (CN)

(73) Assignee: Dongguan Yichen Intelligent Electronics Co., Ltd., Dongguan (CN)

( * ) Notice: Subject to any disclaimer, the term of this patent is extended or adjusted under 35 U.S.C. 154(b) by 0 days.

(21) Appl. No.: 18/297,884

(22) Filed: Apr. 10, 2023

(51) Int. Cl.
*F28F 3/12* (2006.01)
(52) U.S. Cl.
CPC ..................... *F28F 3/12* (2013.01)
(58) Field of Classification Search
CPC .......... F28F 3/12; F28F 2265/12; F28F 11/00; F28F 9/026; H05K 7/20272; H05K 7/20254; H01L 23/427; H01L 2023/4081; H01L 2023/4087; H01L 2023/4093; F01P 11/029; F01P 11/0238; F01P 2011/0266; F01P 2011/0233
See application file for complete search history.

(56) References Cited

U.S. PATENT DOCUMENTS

| | | | | |
|---|---|---|---|---|
| 4,965,144 | A * | 10/1990 | Ng | H01M 50/3425 429/55 |
| 8,459,337 | B2 * | 6/2013 | Seidler | F28F 19/01 165/83 |
| 2006/0021737 | A1 * | 2/2006 | Lee | H01L 23/473 257/E23.098 |
| 2006/0032625 | A1 * | 2/2006 | Angelis | F04D 13/12 165/247 |
| 2009/0044929 | A1 * | 2/2009 | Yeh | F28D 15/00 165/104.19 |
| 2013/0284413 | A1 * | 10/2013 | Ask | F28D 9/00 165/168 |
| 2018/0308786 | A1 * | 10/2018 | Huang | H01L 23/467 |
| 2019/0254193 | A1 * | 8/2019 | Li | H05K 7/20272 |
| 2020/0309018 | A1 * | 10/2020 | Deng | F01P 11/029 |
| 2022/0214112 | A1 * | 7/2022 | Xiao | G06F 1/206 |
| 2023/0069806 | A1 * | 3/2023 | Tokeshi | F28D 1/05383 |

* cited by examiner

*Primary Examiner* — Tho V Duong
(74) *Attorney, Agent, or Firm* — Westbridge IP LLC

(57) ABSTRACT

Disclosed are a water cooling plate and a water cooling radiator having the same. The water cooling plate includes a main body and a water chamber disposed inside the main body, the water chamber has provided therein a pressure bag, the pressure bag has one end sealed through a sealing plug to form a sealed chamber therein. The water cooling radiator includes a water cooling plate and a water block connected to the water cooling plate. Cooling water inside the water cooling plate is pumped, through a water pump, into the water block to absorb heat, and the heated water is returned to the water cooling plate via a water inlet pipe.

13 Claims, 5 Drawing Sheets

WATER COOLING PLATE AND WATER COOLING RADIATOR HAVING SAME

TECHNICAL FIELD

The present disclosure relates to the technical field of radiators, more particular to a water cooling plate and a water cooling radiator having the same.

BACKGROUND

Water cooling radiators have been widely applied to computer cases and server cases. Compared to air cooling, water cooling has a significant effect of heat dissipation for CPU over clocking. However, water cooling needs a bigger case space. Generally, traditional water cooling radiators are composed of a water block, a water cooling plate and a fan disposed on the water cooling plate. A sealed space is formed inside the water cooling plate, and a cooling liquid is circulated inside the water cooling plate. When the cooling liquid is circulated for some time, the temperature will get higher, leading to a high pressure state inside the sealed space. When the pressure is excessive, the water cooling plate could be damaged, or liquid could be leaked at a position of weak sealing. Therefore, it is needed to design a better water cooling plate and water cooling radiator to solve the above problems.

SUMMARY

In view of the problems in the existing technologies, the present disclosure provides a water cooling plate which can balance a pressure therein and a water cooling radiator having the water cooling plate.

In order to achieve the above object, the present disclosure employs the following technical solution.

A water cooling plate includes a main body and a water chamber disposed inside the main body, wherein the water chamber has provided therein a pressure bag, the pressure bag has one end sealed through a sealing plug to form a sealed chamber therein, and when a pressure inside the water chamber becomes greater, the air inside the pressure bag is compressed to balance the pressure inside the water chamber.

Further, the sealing plug has provided thereon a weak part, and when a pressure inside the sealed chamber is excessive, the weak part breaks, so that the air inside the pressure bag is partially leaked out.

Further, the pressure bag is made of silicone or rubber.

Further, the pressure bag is disposed on a side wall of one end of the main body, the side wall of the main body is provided with an open slot, the open slot has a bottom provided with a step, one end of the pressure bag is inserted into the water chamber through the open slot while the other end is limited by the step, the sealing plug has a periphery fastened by a sealing nut, and the sealing nut is tightly screwed onto an inner wall of the open slot.

Further, the main body has one end provided with a water inlet nozzle and a water outlet nozzle, the water inlet nozzle is connected to a water inlet pipe, the water outlet nozzle is connected to a water pump, and the water pump has a water outlet connected to a water outlet pipe.

Further, the water outlet nozzle has a periphery provided with a plurality of retainer rings, two adjacent retainer rings have a sealing ring provided therebetween, and the retainer ring is clamped on a water inlet of the water pump and is sealed through the sealing ring.

Further, the water inlet nozzle and the main body have an elevating column provided therebetween, beside the elevating column is provided a vertical column, the vertical column together with the elevating column fixes a housing, and the housing is detachably installed on a periphery of the water pump.

Further, the housing has an inside provided with an integrated circuit board, the integrated circuit board is connected to each fan through a flat cable, and the fan is located on the main body.

A water cooling radiator includes a water cooling plate and a water block connected to the water cooling plate, wherein the water block is connected to the water cooling plate through a water inlet pipe and a water outlet pipe, a water pump is disposed at a water outlet nozzle of the water cooling plate; cooling water inside the water cooling plate is pumped, through the water pump, into the water block to absorb heat, and the heated water is returned to the water cooling plate via the water inlet pipe; when the water temperature inside the water cooling plate increases, a pressure inside the water cooling plate becomes greater, and the air inside the pressure bag is compressed to balance the pressure inside the water cooling plate.

Further, the water cooling plate has provided thereon a plurality of fans in parallel, the fan has a side surface provided with a power connection part, the water cooling plate has a side surface provided with an integrated circuit board, and the integrated circuit board is connected to the power connection parts respectively through a flat cable.

Further, the water block includes a fixed shell and a heat absorbing sheet disposed on an end part of the fixed shell, the fixed shell has a bottom provided with a water storage area, and water is mixed in the water storage area before flowing to the water cooling plate via the water inlet pipe.

Further, the fixed shell and the heat absorbing sheet have a pad provided therebetween, the pad has a middle part provided with a first through groove, the pad has a bottom fixed with a silicone sheet, the silicone sheet has a middle part provided with a second through groove, both the first through groove and the second through groove correspond to a middle groove inside the fixed shell, and the cooling water is divided to evenly distribute to the water block through the pad and the silicone sheet.

Further, the first through groove has a smaller width than the second through groove.

Further, the fixed shell has a circumferential edge provided with a clamping groove concaved inward, and a U-shaped installation pinch plate has an opening end inserted, from any side of the fixed shell, into the clamping groove to fix.

The present disclosure has the following beneficial effects.

The water chamber has provided therein the pressure bag, the pressure bag has formed therein the sealed chamber, and when the pressure inside the water chamber becomes greater, the air inside the pressure bag is compressed to balance the pressure inside the water chamber, avoiding an excessive pressure occurring inside the water cooling plate to cause damage to the water cooling plate or avoiding the leakage of liquid at a position of weak sealing.

Further, the water pump is disposed at the water outlet nozzle of the water cooling plate, remaining the original construction of the water cooling plate and the complete water pump, increasing the yield rate of the water cooling plate and enabling separate testing of parameters of the water pump. The repair and replacement are convenient too. The integrated circuit board is disposed inside the housing and is connected to each fan through the flat cable, and the integrated circuit board is connected to a machine to power on, making the wiring neater and more beautiful. A user just needs one line of connection to make all fans powered on, which is more convenient.

DETAILED DESCRIPTION OF THE EMBODIMENTS

Figure 1:
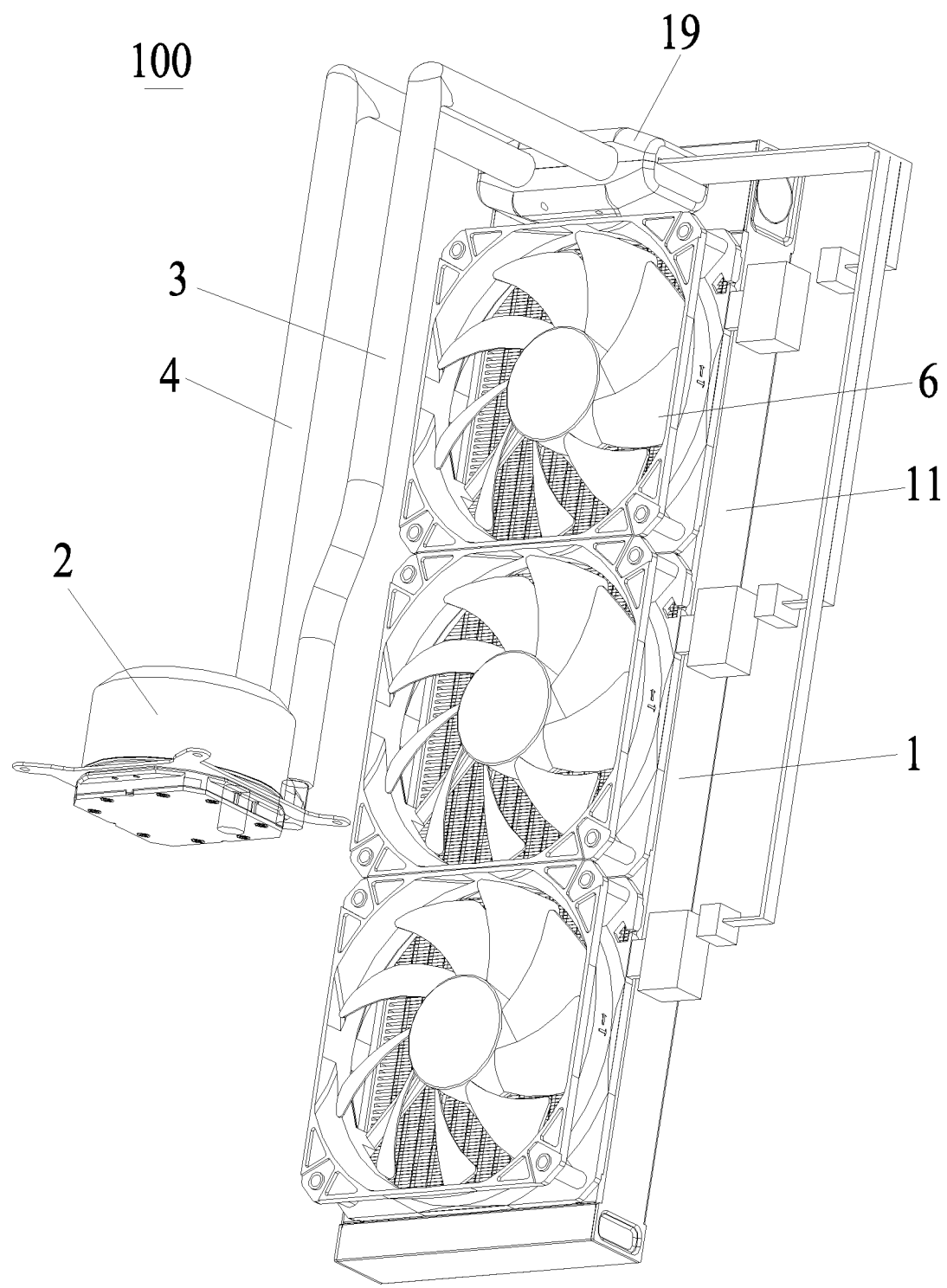
FIG. 1 is a structure diagram of a water cooling radiator according to the present disclosure.
Figure 2:
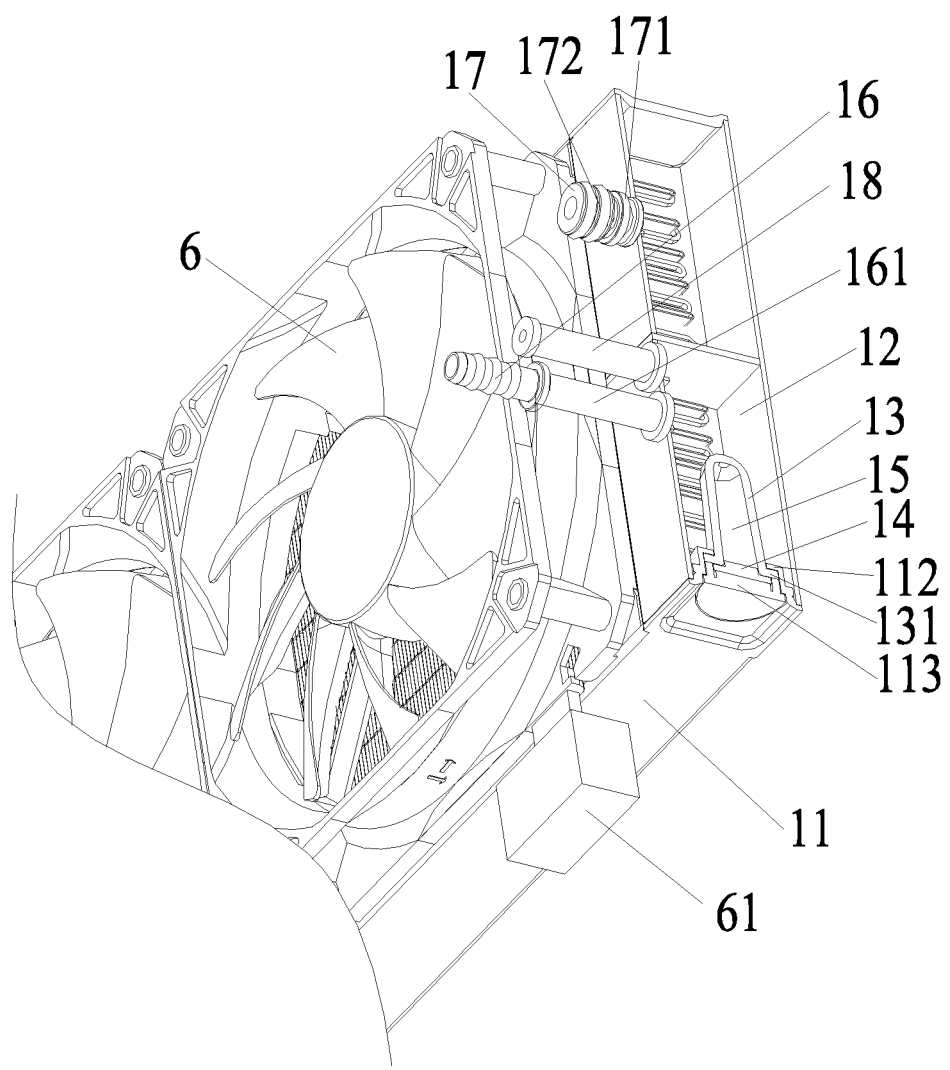
FIG. 2 is a partial structure diagram of a water cooling plate according to the present disclosure.
Figure 3:
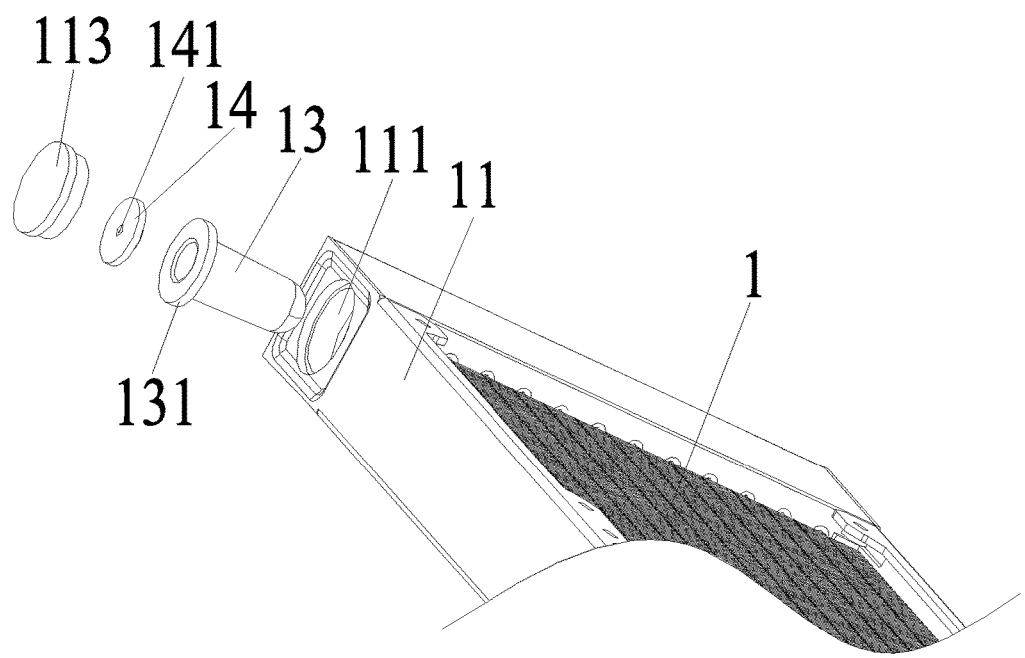
FIG. 3 is an exploded view of a pressure bag in a water cooling plate according to the present disclosure.
Figure 4:
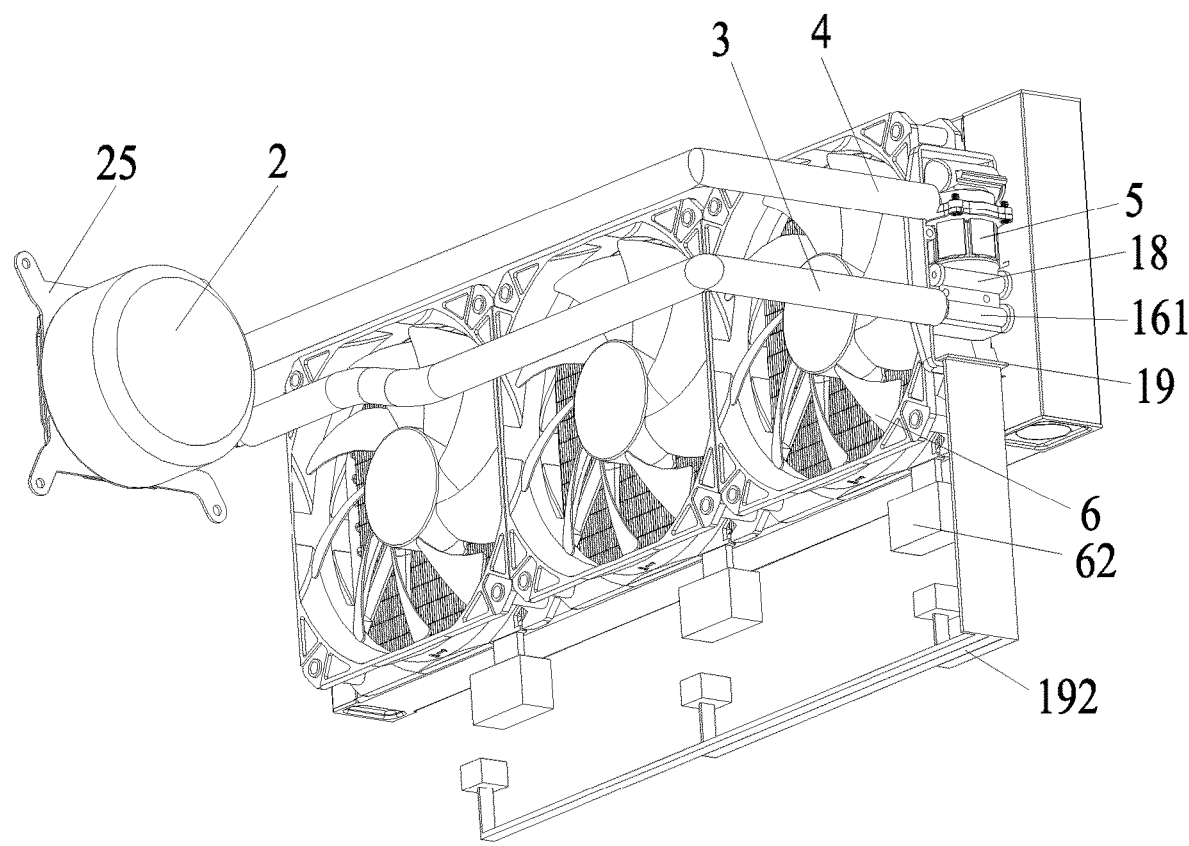
FIG. 4 is a structure diagram of a position in a water cooling plate where a water pump is disposed according to the present disclosure.
Figure 5:
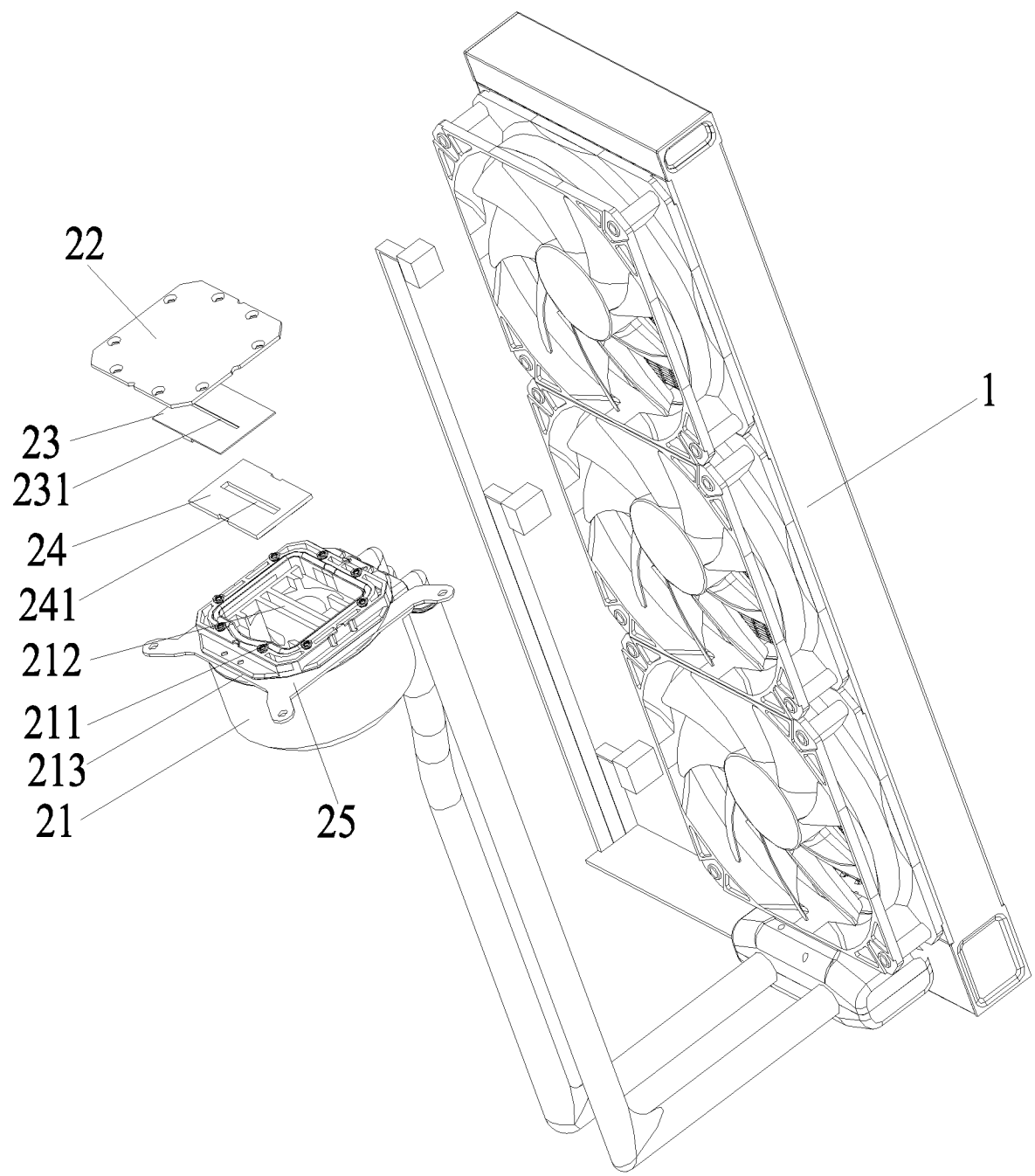
FIG. 5 is a structure diagram of a water block in a water cooling radiator according to the present disclosure.
Figure 6:
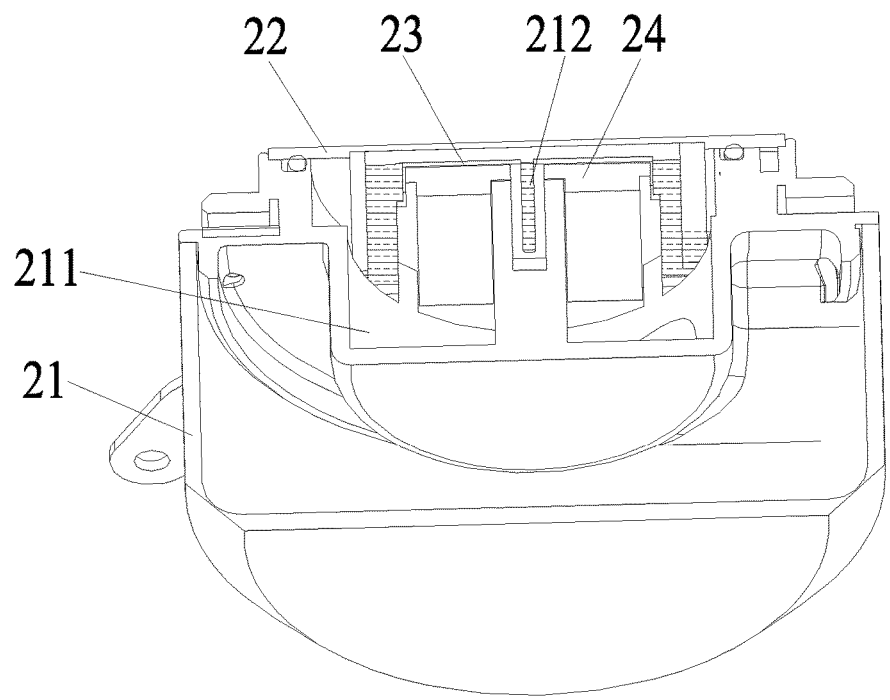
FIG. 6 is a sectional view of a water block in a water cooling radiator according to the present disclosure.
Figure 7:
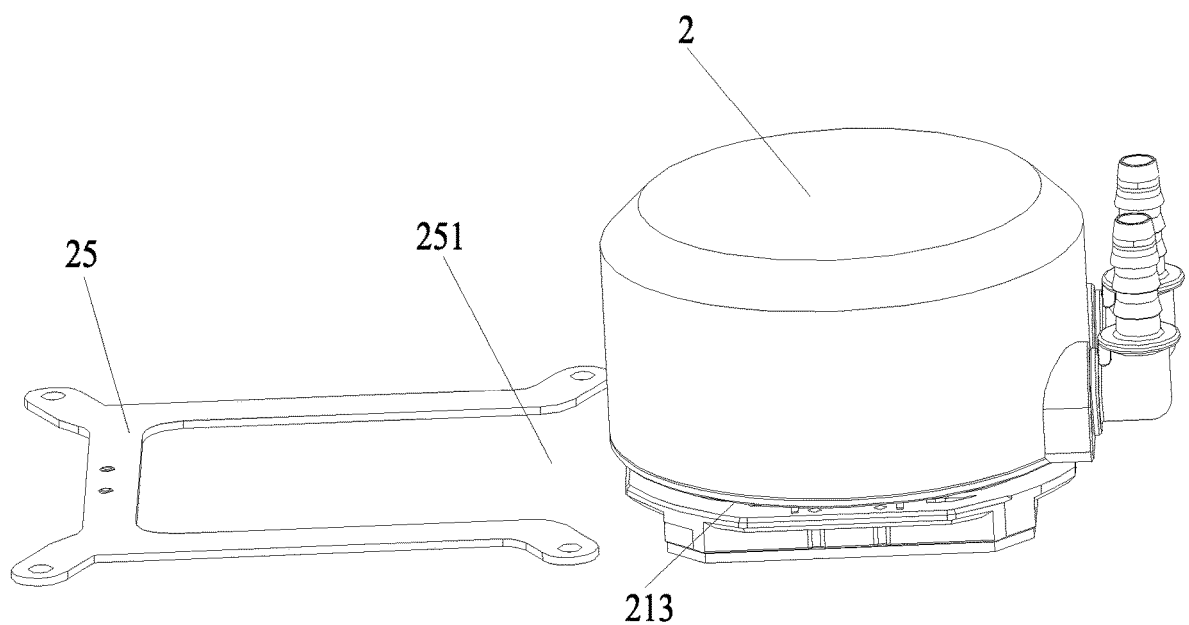
FIG. 7 is a structure diagram of a water block in a water cooling radiator according to the present disclosure.

The technical solutions in the embodiments of the present disclosure will be described clearly and completely hereinafter in conjunction with the drawings in the embodiments of the present disclosure. Apparently, the described embodiments are merely a part of the embodiments of the present disclosure, rather than all the embodiments. Based on the embodiments in the present disclosure, all of other embodiments obtained by the ordinary skill in the art without any creative efforts shall fall into the scope of protection of the present disclosure.

It should be noted that all directional indications (such as upper, lower, left, right, front, rear . . . ) in the embodiments of the present disclosure are merely to illustrate a relative position relation, a relative motion condition, etc. between each part in a certain state (for example, the state shown in the drawings). If the state changes, the directional indication changes accordingly.

As shown in FIG. 1, the present disclosure provides a water cooling plate 1 and a water cooling radiator 100 having the water cooling plate 1, for heat dissipation and cooling of a computer case, a server case, etc.

As shown in FIG. 1 to FIG. 4, a water cooling plate 1 includes a main body 11 and a water chamber 12 disposed inside the main body 11, the water chamber 12 has provided therein a pressure bag 13, the pressure bag 13 has one end sealed through a sealing plug 14 to form a sealed chamber 15 therein, and when a pressure inside the water chamber 12 becomes greater, the air inside the pressure bag 13 is compressed to balance the pressure inside the water chamber 12, avoiding an excessive pressure occurring inside the water cooling plate 1 to cause damage to the water cooling plate 1 or avoiding the leakage of liquid at a position of weak sealing.

In the present embodiment, the pressure bag 13 is disposed on a side wall of one end of the main body 11, the side wall of the main body 11 is provided with an open slot 111, the open slot 111 has a bottom provided with a step 112, one end of the pressure bag 13 is inserted into the water chamber 12 through the open slot 111 while the other end is provided with a convex plate 131, and the convex plate 131 is limited by the step 112. The sealing plug 14 has a periphery fastened by a sealing nut 113, and the sealing nut 113 is tightly screwed onto an inner wall of the open slot 111.

Preferably, the sealing plug 14 has provided thereon a weak part 141, and when a pressure inside the sealed chamber 15 is excessive, the weak part 141 breaks, so that the air inside the pressure bag 13 is partially leaked out. The sealing nut 113 is in threaded connection with the inner wall of the open slot 111, and the sealing plug 14 is fastened and pressed by the sealing nut 113. However, there must be some gap existing at the position of the threaded connection. When the weak part 141 breaks, the air inside the sealed chamber 15 overflows through the weak part 141 and then leaks to outside through the gap at the threaded connection, enabling the air inside the pressure bag 13 to partially leak out and avoiding an excessive pressure occurring to impact the water cooling plate 1. Further, since the gap at the threaded connection is small, even if the weak part 141 breaks, the pressure bag 13 can still balance the pressure of the water cooling plate 1. After the weak part 141 of the sealing plug 14 breaks, the sealing nut 113 can be screwed off quickly and conveniently to replace the sealing plug 14. In the present embodiment, the weak part 141 is a thin part at the center of the sealing plug 14.

In the present embodiment, the pressure bag 13 is made of silicone or rubber, which has certain elasticity and can bear the pressure inside the water cooling plate 1.

The main body 11 has one end provided with a water inlet nozzle 16 and a water outlet nozzle 17, the water inlet nozzle 16 is connected to a water inlet pipe 3, the water outlet nozzle 17 is connected to a water pump 5, and the water pump 5 has a water outlet connected to a water outlet pipe 4. The water outlet nozzle 17 has a periphery provided with a plurality of retainer rings 171, two adjacent retainer rings 171 have a sealing ring 172 provided therebetween, and the retainer ring 171 is clamped on a water inlet of the water pump 5 and is sealed through the sealing ring 172. According to the present disclosure, the water pump 5 is disposed at the position of the water outlet nozzle 17 of the water cooling plate 1, remaining the original construction of the water cooling plate 1 and the complete water pump 5, increasing the yield rate of the water cooling plate 1 and enabling separate testing of parameters of the water pump 5.

The water inlet nozzle 16 and the main body 11 have an elevating column 161 provided therebetween, beside the elevating column 161 is provided a vertical column 18, the vertical column 18 together with the elevating column 161 fixes a housing 19, and the housing 19 is detachably installed on a periphery of the water pump 5. According to the present embodiment, the housing 19 is of two halves, which are fixed through a bolt. When it is needed to repair or replace the water pump 5, just disassemble the housing 19 to operate. It is convenient to replace and repair the water pump 5.

Preferably, the housing 19 has an inside provided with an integrated circuit board 191, the integrated circuit board 191 is connected to each fan 6 through a flat cable 192, and the fan 6 is located on the main body 11. The integrated circuit board 191 is connected to a machine to power on, making the wiring neater and more beautiful. A user just needs one line of connection to make all fans 6 powered on, which is more convenient.

The water cooling radiator 100 according to the present disclosure further includes a water block 2 connected to the above water cooling plate 1. The water block 2 is connected to the water cooling plate 1 through a water inlet pipe 3 and a water outlet pipe 4. A water pump 5 is disposed at a water outlet nozzle 17 of the water cooling plate 1. Cooling water inside the water cooling plate 1 is pumped, through the water pump 5, into the water block 2 to absorb heat, and the heated water is returned to the water cooling plate 1 via the water inlet pipe 3. When the water temperature inside the water cooling plate 1 increases, a pressure inside the water cooling plate 1 becomes greater, and the air inside the pressure bag 13 is compressed to balance the pressure inside the water cooling plate 1.

The water cooling plate 1 has provided thereon a plurality of fans 6 in parallel. In the present embodiment, three fans 6 are disposed in parallel. The fan 6 has a side surface provided with a power connection part 61, the water cooling plate 1 has a side surface provided with an integrated circuit board 191, and the integrated circuit board 191 is connected to the power connection parts 61 respectively through a flat cable 192.

The water block 2 includes a fixed shell 21 and a heat absorbing sheet 22 disposed on an end part of the fixed shell 21, the fixed shell 21 has a middle part provided with a middle groove 212 and has a bottom of two sides thereof provided with a water storage area 211, and water is mixed in the water storage area 211 before flowing to the water cooling plate 1 via the water inlet pipe 3. The fixed shell 21 and the heat absorbing sheet 22 have a pad 23 provided therebetween, the pad 23 has a middle part provided with a first through groove 231, the pad 23 has a bottom fixed with a silicone sheet 24, the silicone sheet 24 has a middle part provided with a second through groove 241, both the first through groove 231 and the second through groove 241 correspond to the middle groove 212 inside the fixed shell 21, the first through groove 231 has a smaller width than the second through groove 241, and the cooling water is divided to evenly distribute to the water block 2 through the pad 23 and the silicone sheet 24. In the present embodiment, the heat absorbing sheet 22 is a copper sheet, and the pad 23 is a hardware pad. Water is mixed in the water storage area 211 after flowing through the heat absorbing sheet 22 and then flows to the water cooling plate 1. The copper sheet can enable a better effect of heat dissipation.

The fixed shell 21 has a circumferential edge provided with a clamping groove 213 concaved inward, a U-shaped installation pinch plate 25 has an opening end 251 inserted, from any side of the fixed shell 21, into the clamping groove 213 to fix. The installation is convenient. The installation pinch plate 25 has four corners fixed onto a machine case through bolts.

According to the water cooling plate 1 and the water cooling radiator 100 in the present disclosure, the pressure bag 13 is disposed inside the water chamber 12 to balance the pressure inside the water chamber 1, avoiding an excessive pressure occurring inside the water cooling plate 1 to cause damage to the water cooling plate 1 or avoiding the leakage of liquid at a position of weak sealing. The water pump 5 is disposed at the water outlet nozzle 17 of the water cooling plate 1, remaining the original construction of the water cooling plate 1 and the complete water pump 5, increasing the yield rate of the water cooling plate 1 and enabling separate testing of parameters of the water pump 5. The repair and replacement are convenient too. The integrated circuit board 191 is disposed inside the housing 19 and is connected to each fan 6 through the flat cable 192, and the integrated circuit board 191 is connected to a machine to power on, making the wiring neater and more beautiful. A user just needs one line of connection to make all fans powered on, which is more convenient.

The above embodiments are merely to describe the technical solution of the present disclosure rather than to limit it. The present disclosure is illustrated in detail with reference to preferred embodiments merely. Those skilled in the art should understand that modifications or equivalent substitutions can be made to the technical solution of the present disclosure without departing from the spirit and scope of the technical solution of the present disclosure, and these modifications or substitutions shall be covered in the scope of the claims appended herein.

What is claimed is:

1. A water cooling plate, comprising a main body and a water chamber disposed inside the main body, wherein the water chamber has provided therein a pressure bag, the pressure bag has one end sealed through a sealing plug to form a sealed chamber therein, and when a pressure inside the water chamber becomes greater, the air inside the pressure bag is compressed to balance the pressure inside the water chamber;

wherein the pressure bag is disposed on a side wall of one end of the main body, the side wall of the main body is provided with an open slot, the open slot has a bottom provided with a step, one end of the pressure bag is inserted into the water chamber through the open slot while the other end is limited by the step, the sealing plug has a periphery fastened by a sealing nut, and the sealing nut is tightly screwed onto an inner wall of the open slot.

2. The water cooling plate according to claim 1, wherein the sealing plug has provided thereon a weak part, and when a pressure inside the sealed chamber is excessive, the weak part breaks, so that the air inside the pressure bag is partially leaked out.

3. The water cooling plate according to claim 1, wherein the pressure bag is made of silicone or rubber.

4. The water cooling plate according to claim 1, wherein the main body has one end provided with a water inlet nozzle and a water outlet nozzle, the water inlet nozzle is connected to a water inlet pipe, the water outlet nozzle is connected to a water pump, and the water pump has a water outlet connected to a water outlet pipe.

5. The water cooling plate according to claim 4, wherein the water outlet nozzle has a periphery provided with a plurality of retainer rings, two adjacent retainer rings have a sealing ring provided therebetween, and the retainer ring is clamped on a water inlet of the water pump and is sealed through the sealing ring.

6. The water cooling plate according to claim 4, wherein the water inlet nozzle and the main body have an elevating column provided therebetween, beside the elevating column is provided a vertical column, the vertical column together with the elevating column fixes a housing, and the housing is detachably installed on a periphery of the water pump.

7. The water cooling plate according to claim 6, wherein the housing has an inside provided with an integrated circuit board, the integrated circuit board is connected to each fan through a flat cable, and the fan is located on the main body.

8. A water cooling radiator, comprising a water cooling plate according to claim 1 and a water block connected to the water cooling plate, wherein the water block is connected to the water cooling plate through a water inlet pipe and a water outlet pipe, a water pump is disposed at a water outlet nozzle of the water cooling plate; cooling water inside the water cooling plate is pumped, through the water pump, into the water block to absorb heat, and the heated water is returned to the water cooling plate via the water inlet pipe; when the water temperature inside the water cooling plate increases, a pressure inside the water cooling plate becomes greater, and the air inside the pressure bag is compressed to balance the pressure inside the water cooling plate.

9. The water cooling radiator according to claim 8, wherein the water cooling plate has provided thereon a plurality of fans in parallel, the fan has a side surface provided with a power connection part, the water cooling plate has a side surface provided with an integrated circuit board, and the integrated circuit board is connected to the power connection parts respectively through a flat cable.

10. The water cooling radiator according to claim 8, wherein the water block comprises a fixed shell and a heat absorbing sheet disposed on an end part of the fixed shell, the fixed shell has a bottom provided with a water storage area, and water is mixed in the water storage area before flowing to the water cooling plate via the water inlet pipe.

11. The water cooling radiator according to claim 10, wherein the fixed shell and the heat absorbing sheet have a pad provided therebetween, the pad has a middle part provided with a first through groove, the pad has a bottom fixed with a silicone sheet, the silicone sheet has a middle part provided with a second through groove, both the first through groove and the second through groove correspond to a middle groove inside the fixed shell, and the cooling water is divided to evenly distribute to the water block through the pad and the silicone sheet.

12. The water cooling radiator according to claim 11, wherein the first through groove has a smaller width than the second through groove.

13. The water cooling radiator according to claim 10, wherein the fixed shell has a circumferential edge provided with a clamping groove concaved inward, and a U-shaped installation pinch plate has an opening end inserted, from any side of the fixed shell, into the clamping groove to fix.

* * * * *